(12) United States Patent
Zhou

(10) Patent No.: US 10,134,849 B2
(45) Date of Patent: Nov. 20, 2018

(54) SEMICONDUCTOR DEVICE AND MANUFACTURING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Ming Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 15/683,237

(22) Filed: Aug. 22, 2017

(65) Prior Publication Data

US 2018/0097068 A1 Apr. 5, 2018

(30) Foreign Application Priority Data

Sep. 30, 2016 (CN) .......................... 2016 1 0871131

(51) Int. Cl.
*H01L 29/16* (2006.01)
*H01L 27/11* (2006.01)
(Continued)

(52) U.S. Cl.
CPC ...... *H01L 29/1606* (2013.01); *H01L 21/0262* (2013.01); *H01L 21/02488* (2013.01);
(Continued)

(58) Field of Classification Search
CPC ............ H01L 29/1606; H01L 29/0665; H01L 21/02527; H01L 21/0262; H01L 21/02488;
(Continued)

(56) References Cited

U.S. PATENT DOCUMENTS 9,972,537 B2 * 5/2018 Jacob .............. H01L 21/823431
2013/0146846 A1 * 6/2013 Adkisson .......... H01L 29/66045
257/27

(Continued)

OTHER PUBLICATIONS

European Search Report for corresponding European Application No. 17188984.3 dated Feb. 20, 2018 (6 pages).

*Primary Examiner* — Charles Garber
*Assistant Examiner* — S. M. S Imitiaz
(74) *Attorney, Agent, or Firm* — Brinks Gilson & Lione

(57) ABSTRACT

The present disclosure relates to the technical field of semiconductor technologies and discloses a semiconductor device and a manufacturing method therefor. The method includes forming a growth substrate by providing a substrate structure containing a sacrificial substrate, a first dielectric layer on the sacrificial substrate, and a plurality of recesses formed through the first dielectric layer and into the sacrificial substrate, by forming a buffer layer covering exposes surfaces of the plurality of recesses, by selectively growing a graphene layer on the buffer layer, and by filling the plurality of recesses with a second dielectric layer. The method further includes attaching the growth substrate to a bonding substrate such that the second dielectric layer attaches to the bonding substrate; removing the sacrificial substrate; and removing the buffer layer so as to expose the graphene layer. The method of present disclosure avoids adverse effects from patterning graphene by using selective growth of graphene on a patterned buffer layer.

12 Claims, 14 Drawing Sheets

(51) Int. Cl.
*H01L 27/12* (2006.01)
*H01L 29/786* (2006.01)
*H01L 21/768* (2006.01)
*H01L 21/02* (2006.01)
*H01L 21/8234* (2006.01)
*H01L 29/66* (2006.01)
*H01L 29/78* (2006.01)
*H01L 29/778* (2006.01)
*H01L 29/10* (2006.01)
*H01L 45/00* (2006.01)
*H01L 21/469* (2006.01)

(52) U.S. Cl.
CPC .. *H01L 21/02527* (2013.01); *H01L 21/02639* (2013.01); *H01L 21/76861* (2013.01); *H01L 21/823431* (2013.01); *H01L 27/1108* (2013.01); *H01L 27/1203* (2013.01); *H01L 29/1037* (2013.01); *H01L 29/66795* (2013.01); *H01L 29/778* (2013.01); *H01L 29/785* (2013.01); *H01L 29/78603* (2013.01); *H01L 29/78684* (2013.01); *H01L 21/02664* (2013.01); *H01L 21/469* (2013.01); *H01L 21/76876* (2013.01); *H01L 45/06* (2013.01)

(58) Field of Classification Search
CPC ............. H01L 29/785; H01L 29/66795; H01L 21/823431; H01L 21/02639; H01L 27/1108; H01L 29/78684; H01L 21/02664
See application file for complete search history.

(56) References Cited

U.S. PATENT DOCUMENTS

| | | | | |
|---|---|---|---|---|
| 2014/0015015 | A1* | 1/2014 | Krivokapic | H01L 21/02527 257/288 |
| 2015/0364592 | A1* | 12/2015 | van Dal | H01L 29/785 257/29 |
| 2016/0013184 | A1* | 1/2016 | Alptekin | H01L 27/0886 257/401 |

* cited by examiner

SEMICONDUCTOR DEVICE AND MANUFACTURING METHOD THEREOF

CROSS-REFERENCE TO RELATED APPLICATION

This application is based on and claims priority to Chinese Patent Application CN201610871131.6, filed Sep. 30, 2016, the entire content of which is incorporated herein by reference.

BACKGROUND

Technical Field

The present disclosure relates to the technical field of semiconductor technologies, particularly to a semiconductor device and a manufacturing method thereof, and more specifically to a graphene semiconductor device and a manufacturing method thereof.

Related Art

Graphene is a two-dimensional crystalline material of carbon atoms, and possess special features such as a forbidden electronic band gap with zero width and high carrier mobility. Since its discovery in 2004, graphene is expected to be used to develop a new generation of electric elements such as transistors that are thinner and of high electric conduction speed.

Existing methods for patterning graphene mainly include a method of photolithography and a method of direct laser raster writing. Although the method of direct laser raster writing introduces no other chemical reagents during a process of patterning the graphene, a patterned feature in the graphene layer obtained using this method may not be fine enough (i.e., may be of insufficient resolution) and a long production cycle. Moreover, the method of photolithography introduces other chemical reagents during etching, and a developing solution and a stripping solution used thereby for, e.g., photoresists, may be problematic. For example, photolithography of graphene may lead to increase in sheet resistance of the obtained patterned graphene.

Therefore, development of technologies related to manufacturing a high-quality semiconductor device having a patterned graphene layer represents one of the major current challenges in semi-conductor technologies.

SUMMARY

To address at least one of the foregoing problems, the present disclosure proposes the at least the following forms of implementations.

According to an aspect of the present disclosure, a method of for manufacturing a semiconductor device is provided, including: forming a growth substrate, where the forming a growth substrate includes: forming a growth substrate by providing a substrate structure containing a sacrificial substrate, a first dielectric layer on the sacrificial substrate, and a plurality of recesses formed through the first dielectric layer and into the sacrificial substrate, by forming a buffer layer covering exposes surfaces of the plurality of recesses, by selectively growing a graphene layer on the buffer layer, and by filling the plurality of recesses with a second dielectric layer. The method further includes attaching the growth substrate to a bonding substrate such that the second dielectric layer attaches to the bonding substrate; removing the sacrificial substrate; and removing the buffer layer so as to expose the graphene layer. The method of present disclosure avoids adverse effects from patterning graphene by using selective growth of graphene on a patterned buffer layer.

In a form, forming the growth substrate above further includes: performing planarization after filling the plurality of recesses with the second dielectric layer so that the second dielectric layer in the plurality of recesses approximately flushes with the first dielectric layer between the plurality of recesses.

In a form, forming the buffer layer covering the exposed surfaces of the plurality of recesses above includes forming, by using an epitaxial growth process, the buffer layer covering the exposed surfaces of the plurality of recesses.

According to another aspect of the present disclosure, another method for manufacturing a semiconductor device is provided, including providing a growth substrate, wherein the growth substrate contains a sacrificial substrate and a first dielectric layer on the sacrificial substrate, a plurality of recesses formed through the first dielectric layer and into the sacrificial substrate, a buffer layer covering surfaces of the plurality of recess, a selectively grown graphene layer on the buffer layer, and a second dielectric layer filling the plurality of recesses. The method further includes attaching the growth substrate to a bonding substrate such that the second dielectric layer attaches to the bonding substrate; removing the sacrificial substrate; and removing the buffer layer so as to expose the graphene layer.

In a form, filling the plurality of recesses with the second dielectric layer includes: filling the plurality of recesses with the second dielectric layer using an atomic layer deposition process or a physical vapor deposition process.

In a form, the second dielectric layer above includes a nonconductive nitride of boron, or an oxide of silicon.

In a form, selectively growing the graphene layer includes selectively growing the graphene layer on the buffer layer using methane and hydrogen.

In a form, the sacrificial substrate above includes silicon.

In a form, removing the sacrificial substrate includes using an etching agent to remove the sacrificial substrate in a wet etching process.

In a form, the etching agent above includes tetramethylammonium hydroxide.

In a form, the buffer layer above includes silicon germanium.

In a form, removing the buffer layer includes removing the buffer layer using a mixed solution of ammonium hydroxide and hydrochloric acid.

In a form, the foregoing methods further include forming a third dielectric layer to cover at least part of the exposed graphene layer.

In a form, the third dielectric layer above includes a nonconductive nitride of boron, or an oxide of silicon.

In a form, forming the gate electrode on the third dielectric layer above is further included.

In a form, the plurality of recesses above each comprises an elongated groove; the second dielectric layer filling the plurality of recesses forms a plurality of fins; the exposed graphene layer covers at least part of the plurality of fins; and the graphene layer and the second dielectric layer form a fin structure.

In a form, the methods above further include: forming a third dielectric layer to cover at least part of the exposed graphene layer; and forming a gate electrode on the third dielectric layer.

In a form, the first dielectric layer includes a dielectric material on which graphene cannot be selectively grown.

According to another one aspect of the present disclosure, a semiconductor device is provided, including: a substrate; a fin structure on the substrate; and a graphene layer covering at least a portion of the fin structure.

In a form, the fin structure in the semiconductor device above includes a plurality of fins and the semiconductor device above further includes a first dielectric layer on the substrate and between the fin structures.

In a form, the graphene layer is provided above the first dielectric layer in the semiconductor device above.

In a form, the find of the fin structure in the semiconductor device above is comprises a second dielectric material.

In a form, the fin structure of the semiconductor device above includes a surface layer of an insulating material.

In a form, the second dielectric material for the semiconductor device above includes an oxide of silicon.

In a form, the first dielectric layer for the semiconductor device above comprises a dielectric material on which graphene cannot be selectively grown.

In a form, the second dielectric layer for the semiconductor device above comprises a nonconductive nitride of boron, or an oxide of silicon.

In a form, the substrate layer above includes silicon.

In a form, a third dielectric layer covering the graphene layer is further included in the semiconductor device above.

In a form, the third dielectric layer above includes a nonconductive nitride of boron, or an oxide of silicon.

In a form, a gate electrode covering part of the third dielectric layer is further included in the semiconductor device above.

According to the following detailed descriptions of the exemplary forms of the present disclosure with reference to the accompanying drawings, other characters and advantages of the present disclosure will become clear.

BRIEF DESCRIPTION OF THE DRAWINGS

The accompanying drawings that form a part of the specification describe forms of the present disclosure, and are used to explain the principles of the present disclosure together with the specification.

With reference to the accompanying drawings, the present disclosure can be understood more clearly according to the following detailed description, where.

DETAILED DESCRIPTION

Figure 1:
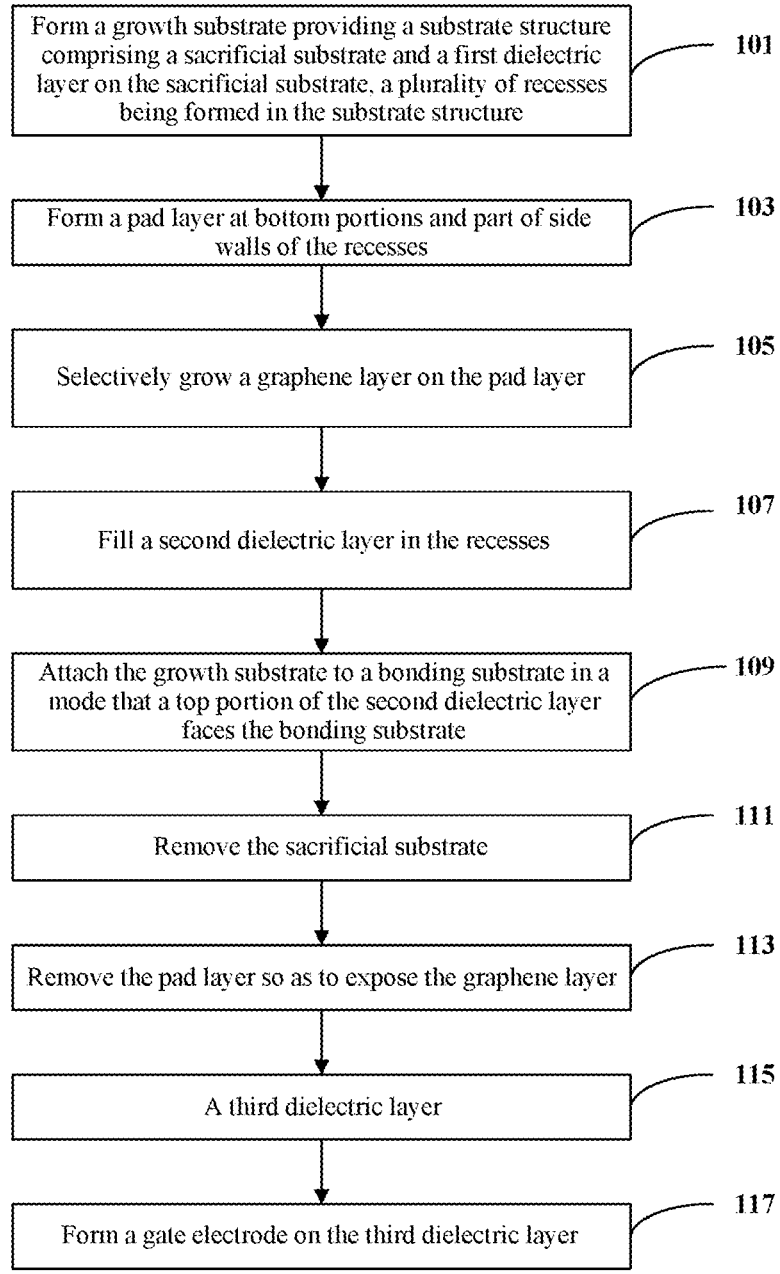
FIG. 1 is a schematic flowchart of a manufacturing method of a semiconductor device.

Exemplary forms of the present disclosure are described in detail with reference to the accompanying drawings. It should be noted that unless being described in detail, relative layouts, mathematical expressions, and numeric values of components and steps described in these forms do not limit the scope of the present disclosure.

In addition, it should be noted that for ease of description, sizes of the parts shown in the accompanying drawings are not drawn according to any actual proportional relationship.

The following description about at least one exemplary form actually is illustrative only, and would not be used as any limitation on the present disclosure and applications or uses of the present disclosure.

Technologies, methods, and devices that are known by a person of ordinary skill in the related fields may not be discussed in detail. However, if appropriate, these technologies, methods, and devices should be considered as a part of the description.

In all examples shown and discussed herein, any specific value should be interpreted to be illustrative only rather than a limitation. Therefore, other examples of the exemplary forms may have different values.

It should be noted that similar reference numerals, labels, and letters represent similar items in the following accompanying drawings. Therefore, once an item is defined in a figure, the item may be but needs not to be further discussed in subsequent figures.

Figure 12:
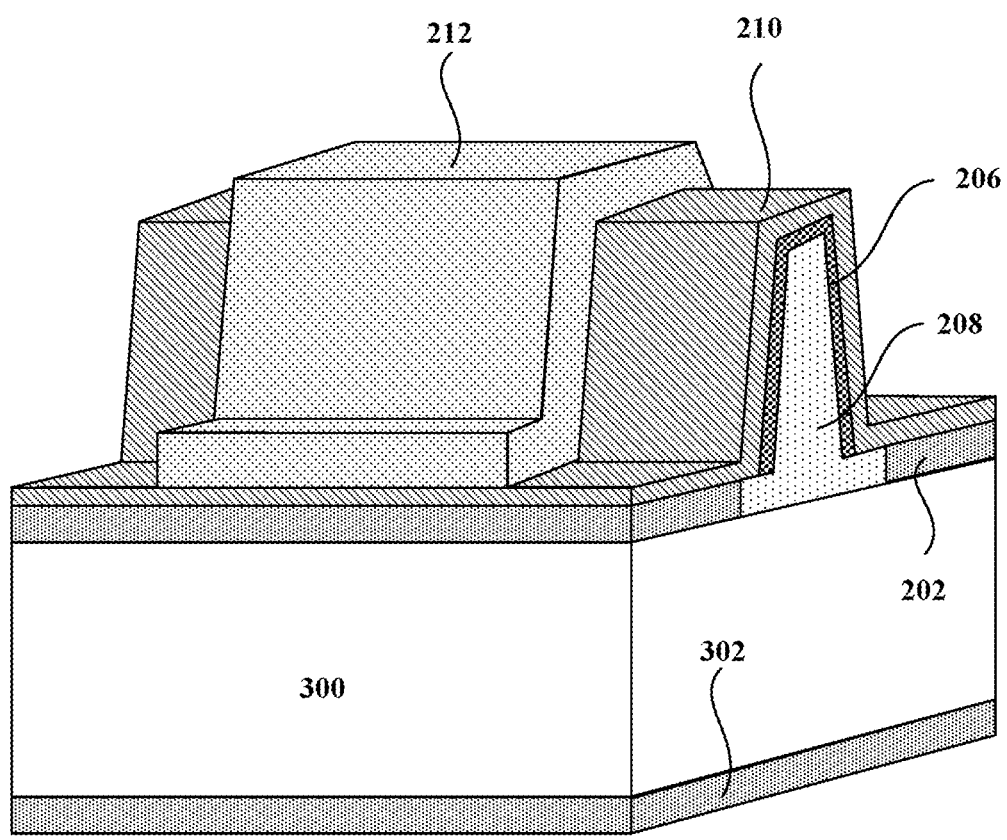
FIG. 12 illustrates schematically a perspective view of a semiconductor device.
Figure 13:
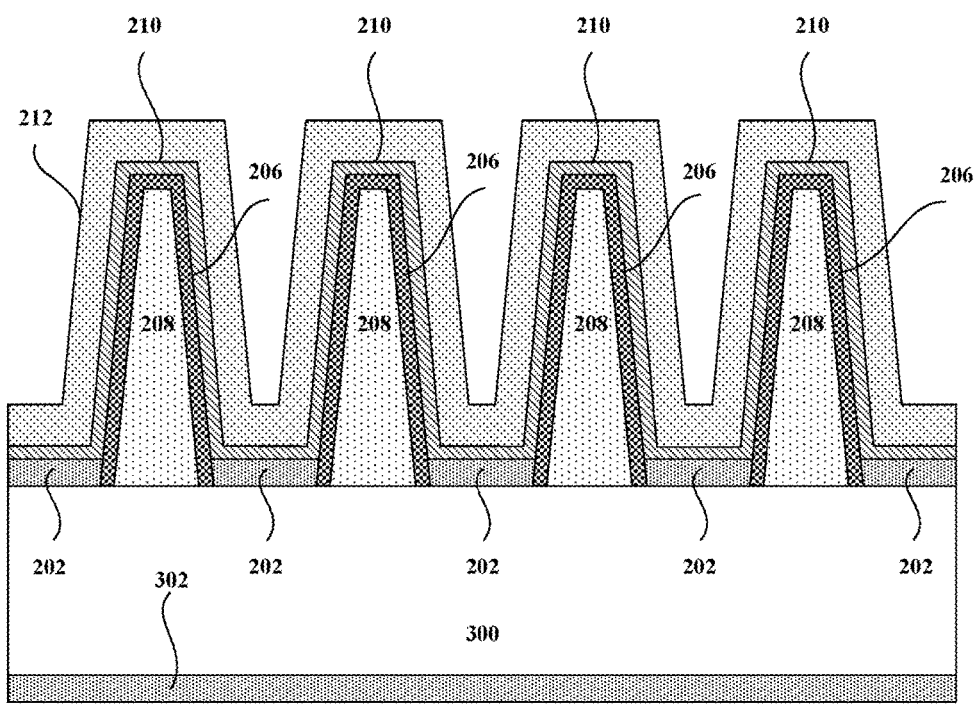
FIG. 13 illustrates schematically a cross-sectional view of a semiconductor device.
Figure 14:
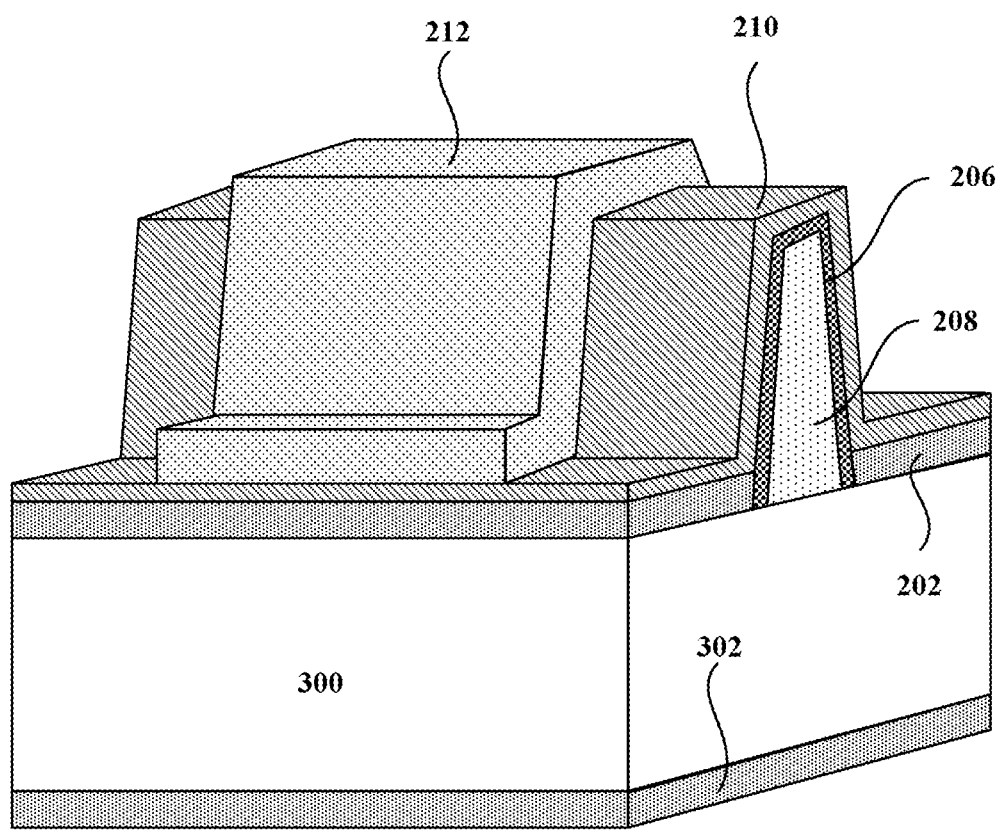
FIG. 14 illustrates schematically a perspective view of another semiconductor device.

FIG. 1 is a schematic flowchart of a manufacturing method of a semiconductor device. FIG. 2 to FIG. 11 illustrate schematically cross-sectional views of several phases of a manufacturing process of a semiconductor device. FIG. 12 illustrates schematically a perspective view of a semiconductor device. FIG. 13 and FIG. 14 illustrate schematically a cross-sectional view and a perspective view of a semiconductor device according to another form of the present disclosure. The following describes the forms of the present disclosure with reference to FIG. 1 to FIG. 14.

As shown in FIG. 1, in step 101, a substrate structure is formed.

Figure 2:
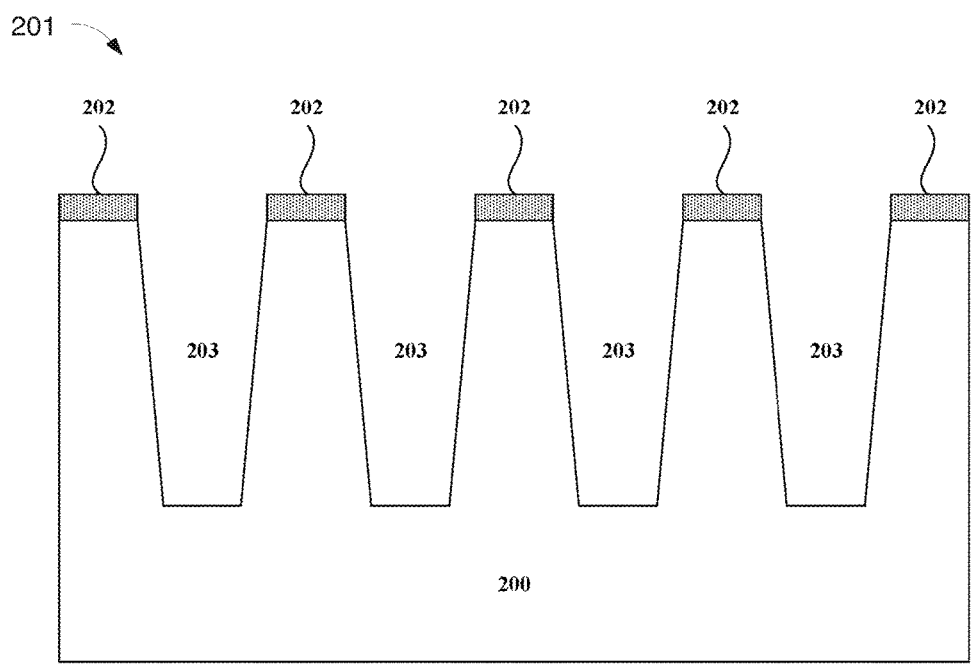
FIG. 2 to FIG. 11 illustrate schematically cross-sectional views of several phases of a manufacturing process of a semiconductor device.

First, a substrate is provided. As shown in FIG. 2, the substrate may include a sacrificial substrate 200 and a first dielectric layer 202 on the sacrificial substrate 200. A plurality of recesses 203 are formed in the substrate to provide the substrate structure 201. Specifically, the recesses 203 may be formed in the first dielectric layer 202 and bottom portions and part of side walls of the recesses 203 may be located in the sacrificial substrate 200. In other words, the recesses 203 may be formed through the first dielectric layer 202 and into the sacrificial substrate 200. A material of the sacrificial substrate 200 may include a semiconductor material such as silicon.

Figure 5:
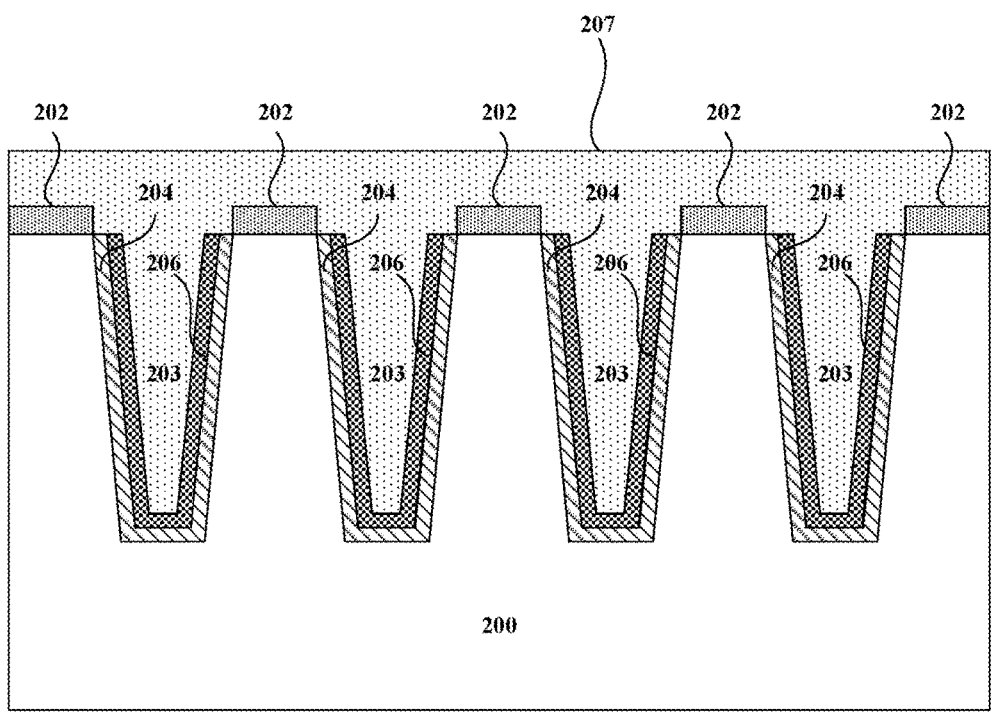

In an implementation, a material of the first dielectric layer 202 comprises a dielectric material on which graphene cannot be selectively grown (see FIG. 5 for how to avoid growing graphene on the first dielectric layer in subsequent steps of selectively growing a graphene layer). For example, a material for the first dielectric layer 202 may comprise an oxide of silicon.

It should be understood that the substrate structure 201 of the present disclosure may be formed by using methods, process steps, and materials known in this field. Therefore, details of a process of forming the substrate structure 201 are not described herein in detail.

In an implementation, each of the recesses 203 of the substrate structure 201 may comprise an elongated groove.

Back to FIG. 1, in step 103, a buffer layer at bottom portions and part of side walls of the recesses is formed.

Figure 3:
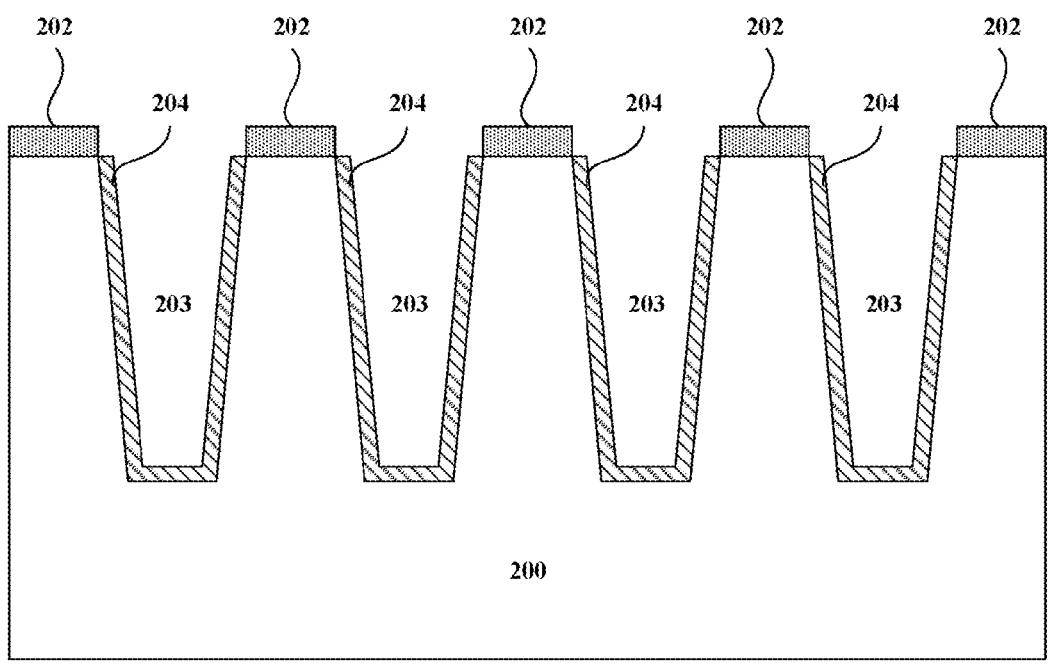

In an implementation, as shown in FIG. 3, a buffer layer 204 may be formed at bottom portions and part of the side walls of the recesses 203 by using, e.g., an epitaxial growth process. The buffer layer may be alternatively referred to as a pad layer. The buffer layer will be used to facilitate a growth of graphene. A material of the buffer layer 204 may include silicon germanium, or another material known by a person of ordinary skill in the art and on which graphene can be selectively grown.

Subsequently, as shown in FIG. 1, in step 105, a graphene layer is selectively grown on the buffer layer.

Figure 4:
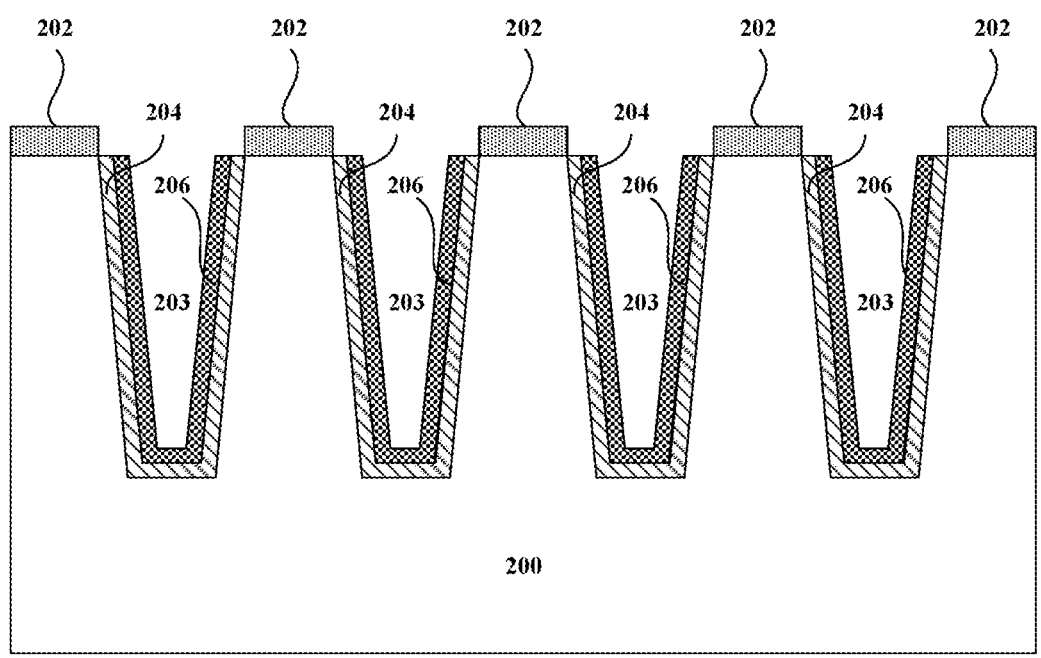

In an implementation, a graphene layer 206 may be selectively grown on the buffer layer 204 as shown in FIG. 4, using, for example, methane and hydrogen. The graphene layer 206 may also be selectively grown on the buffer layer 204 using another process for selective growth of graphene that is known by a person of ordinary skill in the art.

In an implementation, a material of the first dielectric layer 202 may comprise a dielectric material on which graphene cannot be selectively grown. Therefore, no graphene layer may be grown on top portions and side walls of the first dielectric layer 202, as shown in FIG. 4.

Subsequently, as shown in FIG. 1, in step 107, the recesses is filled with a second dielectric layer.

In an implementation, as shown in FIG. 5, a second dielectric layer 207 is used to fill the recesses 203 by using, for example, an atomic layer deposition (ALD) process or a physical vapor deposition (PVD) process. A preferable process for depositing the second dielectric layer may be chosen so as to avoid introducing oxygen into the graphene layer 206. Introduction of oxygen into the graphene layer may adversely affect the performance of a resulting device. For example, processes such as a chemical vapor deposition (CVD) process may introduce oxygen into the graphene layer and may not be a preferable process for depositing the second dielectric layer 207. A material of the second dielectric layer 207 may include: a nonconductive nitride of boron or an oxide of silicon. When the material of the second dielectric layer 207 is an oxide of silicon, the second dielectric layer 207 may be preferably deposited using the PVD process.

Figure 6:
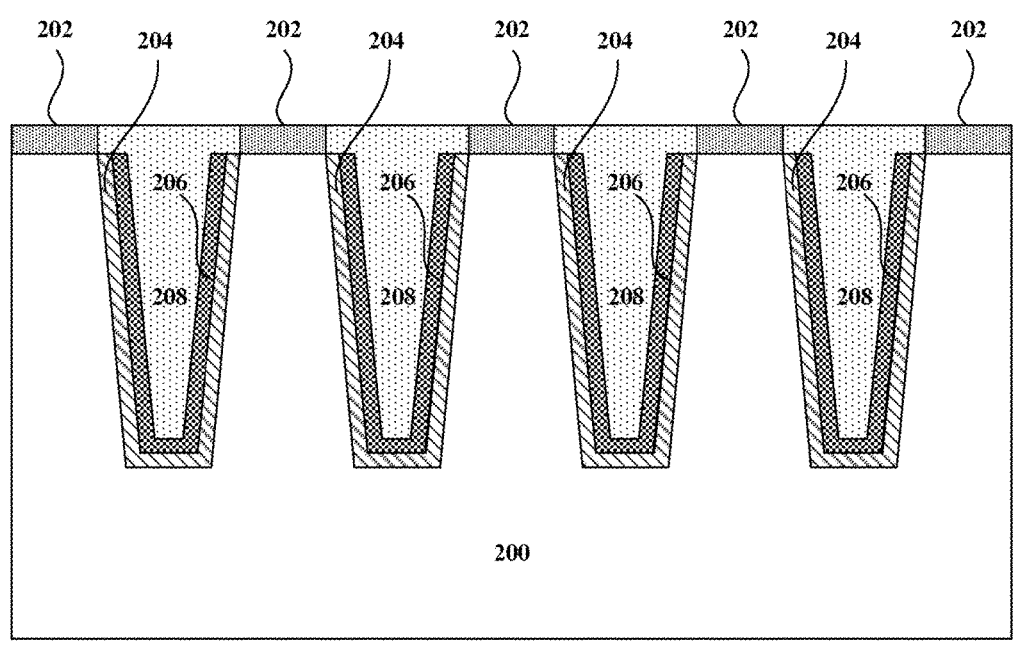

In an implementation, a planarization process may be performed after step 107, so that a top portion of the second dielectric layer 207 in the recesses approximately flushes top portions of the first dielectric layer 202 between the recesses, as shown in FIG. 6. In a specific implementation, each of the recesses 203 may comprise an elongated groove, so that the second dielectric layer 207 filled in the recesses 203 forms a fin 208, as shown in FIG. 6.

In another alternative implementation, in step 103, the buffer layer 204 may be formed to cover top portions and side walls of the first dielectric layer 202. Subsequently, in step 105, the graphene layer 206 is selectively grown on the buffer layer 204. Subsequently, in step 107, the second dielectric layer 207 is deposited to cover the graphene layer 206, where the second dielectric layer 207 further fills the recesses 203. Afterwards, a planarization process is performed, so that top portions of the second dielectric layer 207 in the recess approximately flushes with the top portion of the first dielectric layer 202 between the recesses. In this implementation manner, a buffer layer 204 and a graphene layer 206 are also grown on side walls of the first dielectric layer 202 (not shown in FIG. 6).

In another implementation alternative to the implementations above, in step 103, the buffer layer 204 may be formed to cover top portions of the first dielectric layer 202. For example, an alumina layer may be formed on the structure shown in FIG. 2 through deposition (for example, atomic layer deposition (ALD)); and then a part of the alumina layer at a top portion may be removed by using a patterned mask, so as to form a structure shown in FIG. 3. Subsequently, in step 105, the graphene layer 206 is selectively grown on the buffer layer 204. Afterwards, process steps similar to those described above may be performed.

The structure obtained above as shown in FIG. 6 may be referred to as a growth substrate. Returning to FIG. 1, in step 109, the growth substrate is further attached to a bonding substrate.

Figure 7:
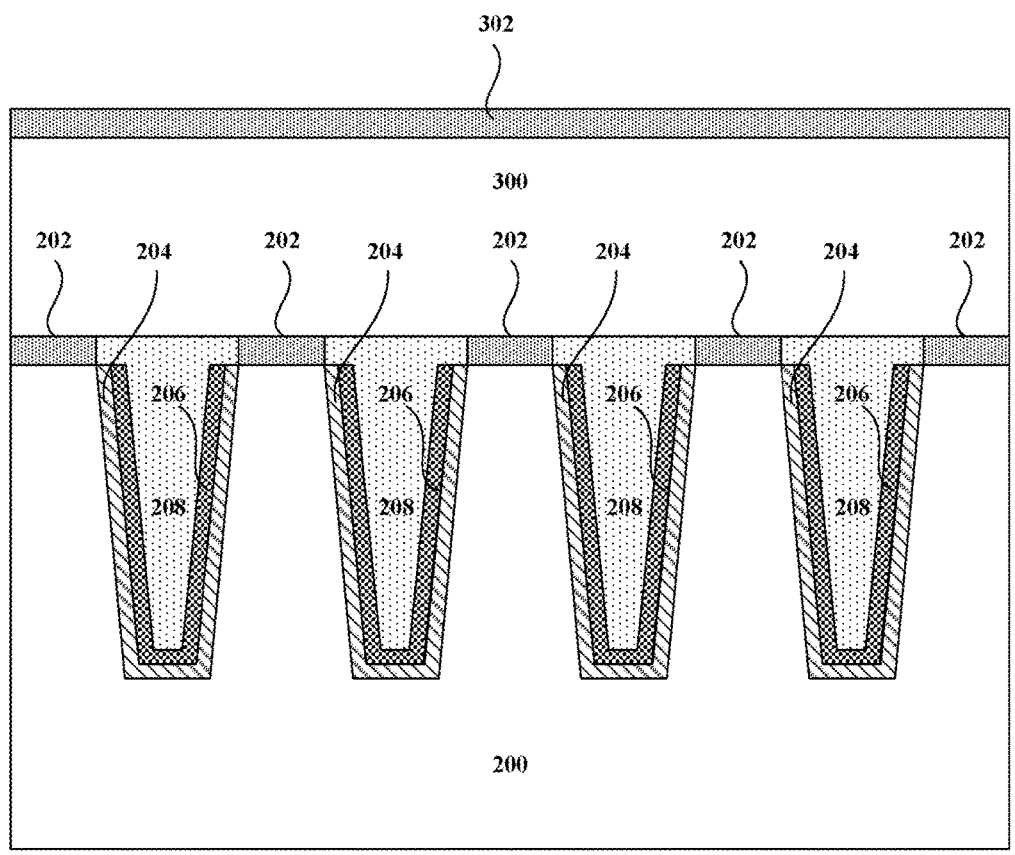

In an implementation, as shown in FIG. 7, the growth substrate is attached to a bonding substrate 300 in a manner that top portion of the second dielectric layer 207 (i.e., the base portion of the fin 208 or the side of the growth substrate facing away from the sacrificial substrate layer 200) faces the bonding substrate 300. For example, the growth substrate may be attached to the bonding substrate 300 by means of solid solution, interference fit, or bonding (e.g., through hydrogen bonding at a surface). A material of the bonding substrate 300 may include a semiconductor material such as silicon. Optionally, a dielectric layer 302 may also be formed on a surface of the bonding substrate 300 that is opposite to a bonding surface at which the bonding substrate 300 is attached to the growth substrate, as shown in FIG. 7.

Subsequently, in step 111, the sacrificial substrate is removed.

Figure 8:
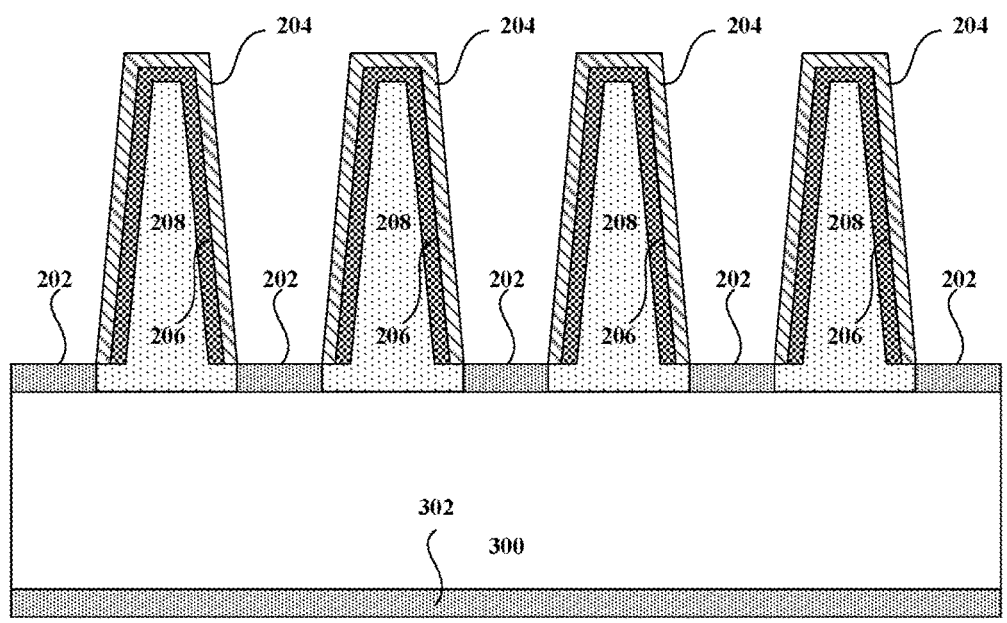

In an implementation, the sacrificial substrate 200 is removed, as shown in FIG. 8, by using an etching agent according to a wet etching process. Depending on the material used for the sacrificial substrate 200, the etching agent may include, for example, tetramethylammonium hydroxide (TMAH), or a mixed solution of ammonium hydroxide and hydrochloric acid.

Figure 9:
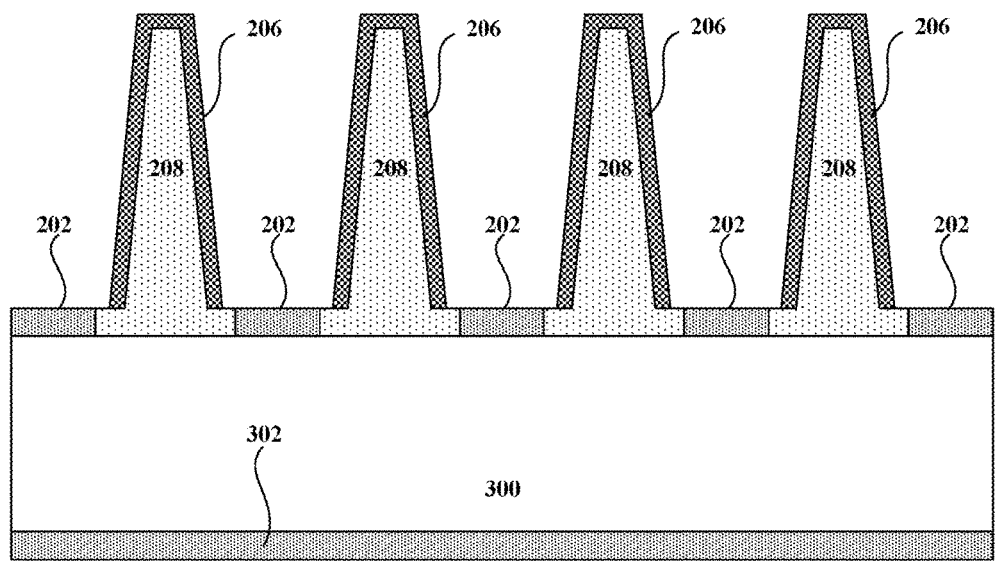

Subsequently, in step 113, the buffer layer is removed so as to expose the graphene layer, as shown in FIG. 9.

In an implementation, the buffer layer 204 may comprise silicon germanium (SiGe) and may be removed by using a mixed solution of ammonium hydroxide and hydrochloric acid, so as to expose the graphene layer 206, as shown in FIG. 9. The buffer layer 204 may also be removed, under a condition that the graphene layer 206 is not damaged, by using another method known by a person of ordinary skill in the art.

Optionally, as shown in FIG. 1, a third dielectric layer 210 may be further formed in step 115.

Figure 10:
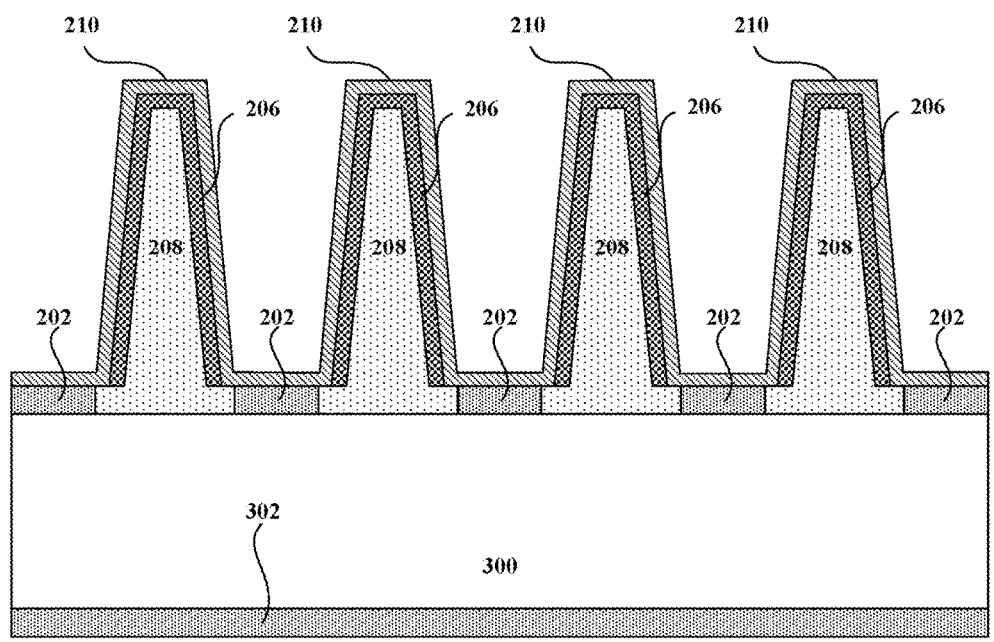

As shown in FIG. 10, the third dielectric layer 210 at least covers part of the exposed graphene layer 206. A material of the third dielectric layer 210 may include a nonconductive nitride of boron or an oxide of silicon. For example, the third dielectric layer 210 may be formed using a PVD process. The third dielectric layer 210 may also be formed using another method known by a person of ordinary skill in the art.

Optionally, as shown in FIG. 1, a gate electrode on the third dielectric layer may be further formed in step 117.

Figure 11:
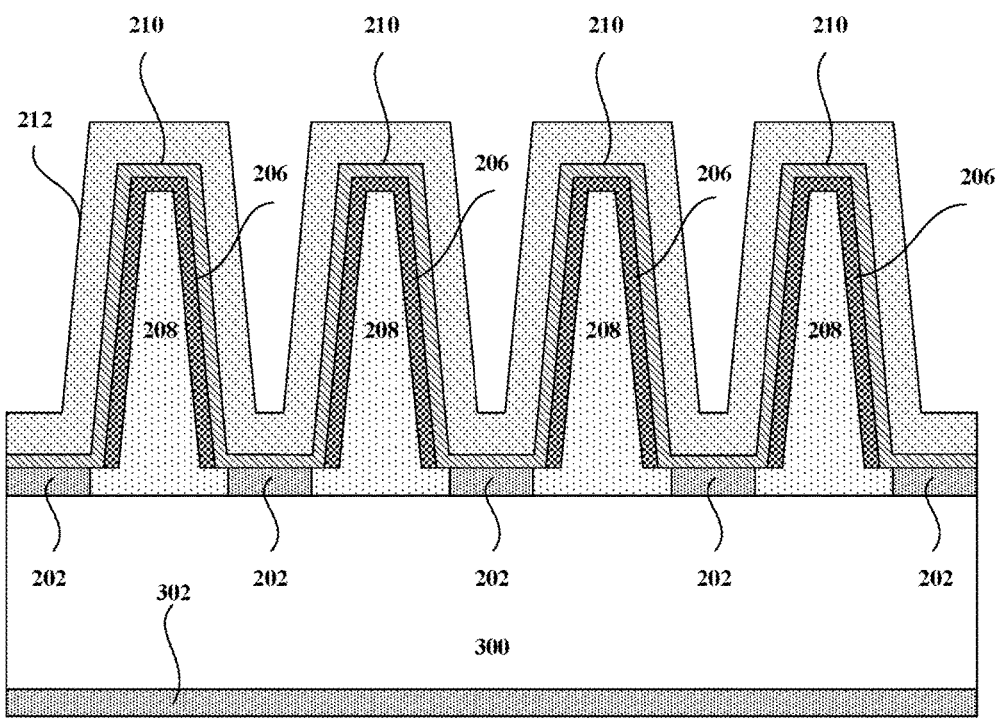

As shown in FIG. 11, a gate electrode 212 is formed on the third dielectric layer 210. It should be understood that the gate electrode of the present disclosure may be formed by using methods, process steps, and materials known in this field. Therefore, details of a process of forming the gate electrode are not described herein. A perspective view of an semiconductor device obtained from the process above and comprising one fin 208 is shown in FIG. 12.

A cross-sectional diagram of a semiconductor device obtained according to another implementation of a manufacturing method of the foregoing semiconductor device is shown in FIG. 13, where a graphene layer 206 is also grown on a side wall of the first dielectric layer 202. A perspective view of the semiconductor device obtained by using this method is shown in FIG. 14.

The manufacturing methods of the semiconductor device in the forms above may reduce complexity of patterning the graphene layer by selectively growing a graphene layer on a patterned buffer layer, thereby avoiding adverse effects from patterning graphene using etching processes such as direct laser raster writing or photoetching.

It should be understood that when an element (such as a layer, an area, or a substrate) is called as being on another element, the element may be directly on the another element or there may also be an intermediate element. In addition, a relative term such as "below . . . " or "above . . . " may be used herein to describe a relationship of a layer or an area relative to another layer or area. It should also be understood that these terms are aimed at including different orientations of a device besides an orientation described in the accompanying drawings. As used herein, the term "and/or" includes any or all combinations of one or more of listed items that are associated with each other, and may also be abbreviated as "/".

It should be understood that this disclosure further teaches a semiconductor device, including: a substrate, a fin structure on the substrate, and a graphene layer covering a top portion and at least an upper portion of a side wall of each fin of the fin structure.

In an implementation, a first dielectric layer on the substrate and between the fin structures is further included.

In an implementation, the graphene layer is above the first dielectric layer.

In an implementation, the fin structure comprises a second dielectric material.

In an implementation, the fin structure comprises a surface layer formed by an insulating material.

In an implementation, the second dielectric material comprises an oxide of silicon.

In an implementation, the first dielectric layer comprises a dielectric material on which graphene cannot be selectively grown.

In an implementation, the second dielectric layer comprises a nonconductive nitride of boron or an oxide of silicon.

In an implementation, the substrate layer comprises silicon.

In an implementation, a third dielectric layer covering the graphene layer is further included.

In an implementation, the third dielectric layer comprises a nonconductive nitride of boron or an oxide of silicon.

In an implementation, a gate electrode covering a part of a top portion and a part of a side wall of each fin of the fin structure is further included.

Heretofore, a semiconductor device and a manufacturing method thereof according to the forms of this disclosure are described in detail. To avoid obscuring the teaching of this disclosure, some details generally known in this field are not described; and according to the description above, a person of ordinary skill in the art would completely understand how to implement a technical solution disclosed herein. In addition, this specification discloses that the taught forms may be combined freely. A person of ordinary skill in the art should understand that various variations may be made to the forms described above without departing from the spirit and scope of this disclosure that are defined by the appended claims.

What is claimed is:

1. A method for manufacturing a semiconductor device, comprising:
   forming a growth substrate, comprising:
   providing a substrate structure comprising a sacrificial substrate, a first dielectric layer on the sacrificial substrate, and a plurality of recesses formed through the first dielectric layer and into the sacrificial substrate;
   forming a buffer layer covering exposed surfaces of the plurality of recesses;
   selectively growing a graphene layer on the buffer layer; and
   filling the plurality of recesses with a second dielectric layer;
   attaching the growth substrate to a bonding substrate such that the second dielectric layer attaches to the bonding substrate;
   removing the sacrificial substrate; and
   removing the buffer layer so as to expose the graphene layer.

2. The method according to claim 1, wherein forming the growth substrate further comprises:
   performing planarization after filling the plurality of recesses with the second dielectric layer so that the second dielectric layer in the plurality of recesses approximately flushes with the first dielectric layer between the plurality of recesses.

3. The method according to claim 1, wherein forming the buffer layer covering the exposed surfaces of the plurality of recesses comprises:
   forming, by using an epitaxial growth process, the buffer layer covering the exposed surfaces of the plurality of recesses.

4. The method according to claim 1, wherein filling of the plurality of recesses with the second dielectric layer comprises:
   filling the plurality of recesses with the second dielectric layer using an atomic layer deposition process or a physical vapor deposition process.

5. The method according to claim 1, wherein selectively growing the graphene layer comprises:
   selectively growing the graphene layer on the buffer layer using methane and hydrogen.

6. The method according to claim 1, wherein removing the sacrificial substrate comprises using an etching agent to remove the sacrificial substrate in a wet etching process.

7. The method according to claim 1, further comprising:
   forming a third dielectric layer to cover at least part of the exposed graphene layer.

8. The method according to claim 7, further comprising:
   forming a gate electrode on the third dielectric layer.

9. The method according to claim 1, wherein:
   the plurality of recesses each comprises an elongated groove;
   the second dielectric layer filling the plurality of recesses forms a plurality of fins;
   the exposed graphene layer covers at least part of the plurality of fins; and
   the graphene layer and the second dielectric layer form a fin structure.

10. The method according to claim 9, wherein the method further comprises:
    forming a third dielectric layer to cover at least part of the exposed graphene layer; and
    forming a gate electrode on the third dielectric layer.

11. The method according to claim 1, wherein the first dielectric layer comprises a dielectric material on which graphene cannot be grown.

12. A method for manufacturing a semiconductor device, comprising:
    providing a growth substrate, wherein the growth substrate comprises:
    a sacrificial substrate and a first dielectric layer on the sacrificial substrate;

a plurality of recesses formed through the first dielectric layer and into the sacrificial substrate;

a buffer layer covering surfaces of the plurality of recess;

a selectively grown graphene layer on the buffer layer; and a second dielectric layer filling the plurality of recesses;

attaching the growth substrate to a bonding substrate such that the second dielectric layer attaches to the bonding substrate;

removing the sacrificial substrate; and removing the buffer layer so as to expose the graphene layer.

* * * * *